United States Patent
Wang et al.

(10) Patent No.: US 9,607,977 B1
(45) Date of Patent: Mar. 28, 2017

(54) ELECTROSTATIC DISCHARGE PROTECTION DEVICE AND METHOD FOR PRODUCING AN ELECTROSTATIC DISCHARGE PROTECTION DEVICE

(71) Applicant: UNITED MICROELECTRONICS CORP., Hsin-Chu (TW)

(72) Inventors: Li-Cih Wang, Taoyuan (TW); Mei-Ling Chao, Hsinchu (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 31 days.

(21) Appl. No.: 14/920,902

(22) Filed: Oct. 23, 2015

(30) Foreign Application Priority Data

Sep. 21, 2015 (TW) .............................. 104131092 A

(51) Int. Cl.
| | |
|---|---|
| *H01L 27/02* | (2006.01) |
| *H01L 29/10* | (2006.01) |
| *H01L 29/78* | (2006.01) |
| *H01L 21/8249* | (2006.01) |
| *H01L 21/8234* | (2006.01) |

(52) U.S. Cl.
CPC ...... *H01L 27/0259* (2013.01); *H01L 21/8249* (2013.01); *H01L 21/823475* (2013.01); *H01L 27/0262* (2013.01); *H01L 27/0266* (2013.01); *H01L 29/1095* (2013.01); *H01L 29/78* (2013.01); *H01L 29/7816* (2013.01)

(58) Field of Classification Search
CPC ............ H01L 27/0259; H01L 27/0262; H01L 27/0266

See application file for complete search history.

(56) References Cited

U.S. PATENT DOCUMENTS

| | | | |
|---|---|---|---|
| 7,038,898 B1 | 5/2006 | Pasqualini | |
| 9,042,065 B2 | 5/2015 | Van Wijmeersch | |
| 2013/0265676 A1* | 10/2013 | Prabhu | ................... H02H 9/046 361/56 |

* cited by examiner

*Primary Examiner* — Douglas Menz

(74) *Attorney, Agent, or Firm* — Winston Hsu; Scott Margo

(57) ABSTRACT

An electrostatic discharge protection device includes an anode, a cathode, a negative voltage holding transistor and a positive voltage holding transistor. The anode is coupled to an input terminal, and the cathode is coupled to a ground. The negative voltage holding transistor includes an N-well. The positive voltage holding transistor includes an N-well. The N-well of the positive voltage holding transistor and the N-well of the negative voltage holding transistor are coupled together and are float. The negative voltage holding transistor and the positive voltage holding transistor are coupled between the anode and the cathode in a manner of back-to-back.

29 Claims, 10 Drawing Sheets

ELECTROSTATIC DISCHARGE PROTECTION DEVICE AND METHOD FOR PRODUCING AN ELECTROSTATIC DISCHARGE PROTECTION DEVICE

BACKGROUND OF THE INVENTION

1. Field of the Invention

The invention relates to an electrostatic discharge protection structure, and more particularly, to an electrostatic discharge protection structure capable of enduring negative voltage.

2. Description of the Prior Art

Electrostatic discharge is an effect due to electrical charges in an object flowing to another object through a discharging path when two electrically charged objects contact or short to each other. The electrostatic discharge can generate huge currents in a very short time and can damage an integrated circuit. Since the human body, machines used to package integrated circuits, and instruments for testing integrated circuits are all common charged bodies, the static electric charges of a charged body may discharge to a chip and cause irreversible harm to the chip once the charged body contacts with the chip. Therefore, an electrostatic discharge protection device is designed to provide a low resistance discharge path for the huge currents induced during electrostatic discharge to pass by and to protect the integrated circuit from being blown out.

To avoid the case that the electrostatic discharge protection device may be accidentally turned on under a normal operation situation and disturb the operation of the protected chip, the holding voltage of the electrostatic discharge protection device should be outside of the operational voltage range of the chip. For example, if the operational voltage range of a chip is between 1.2V and 1.5V, then the holding voltage of the electrostatic discharge protection device should be greater than 1.5V so that the electrostatic discharge protection device will not be turned on when an input voltage of the chip is 1.5V. However, in some applications, the operational voltage range of a chip may include negative voltage. For example, the operational voltage range may be −3V to 3V. In some cases, the upper limit and the lower limit of the operational voltage range may even be unsymmetrical, such as an operational voltage range between −10V to 20V. However, the common electrostatic discharge protection device may only protect the chip from being damaged by currents in the same direction and within limited ranges of voltage. Therefore, the design of the electrostatic discharge protection device is rather inflexible and may even cause inconvenience when producing the electrostatic discharge protection device.

SUMMARY OF THE INVENTION

One embodiment of the present invention discloses an electrostatic discharge protection structure. The electrostatic discharge protection structure comprises an anode, a cathode, a first negative voltage holding transistor and a first positive voltage holding transistor. The anode is coupled to an input terminal, and the cathode is coupled to a ground terminal. The first negative voltage holding transistor comprises an N-well, and the first positive voltage holding transistor comprises an N-well coupled to the N-well of the first negative voltage holding transistor. The first negative voltage holding transistor and the first positive voltage holding transistor are coupled in series between the anode and the cathode in a manner of back-to-back. The N-well of the first positive voltage holding transistor is floating.

Another embodiment of the present invention discloses a method for producing an electrostatic discharge protection structure. The method comprises deriving an operational voltage range of an input terminal to be protected, determining types of at least one negative voltage holding transistor and at least one positive voltage holding transistor according to the operational voltage range, determining a total number of the at least one negative voltage holding transistor and a total number of the at least one positive voltage holding transistor according to the operational voltage range and the types of the at least one negative voltage holding transistor and the at least one positive voltage holding transistor, coupling the at least one negative voltage holding transistor and the at least one positive voltage holding transistor in series between the input terminal and aground terminal in a manner of back-to-back, and coupling an N-well of a first positive voltage holding transistor of the at least one positive voltage holding transistor to an N-well of a first negative voltage holding transistor of the at least one negative voltage holding transistor. The N-well of first positive voltage holding transistor is floating.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
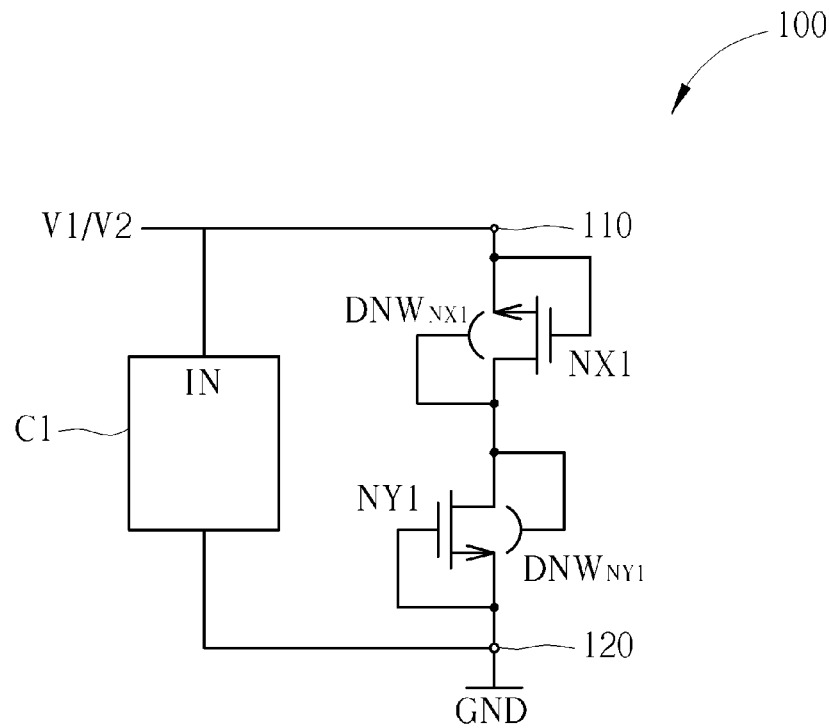
FIG. 1 shows an electrostatic discharge protection device according to one embodiment of the present invention.

FIG. 1 shows an electrostatic discharge protection device 100 according to one embodiment of the present invention. The electrostatic discharge protection device 100 includes an anode 110, a cathode 120, a negative voltage holding transistor NX1 and a positive voltage holding transistor NY1. The anode 110 is coupled to an input terminal of a chip C1 to be protected, and the cathode 120 is coupled to a ground terminal GND.

In FIG. 1, the negative voltage holding transistor NX1 and the positive voltage holding transistor NY1 are both N-type metal oxide semiconductor transistors. The negative voltage holding transistor NX1 has a first terminal, a second terminal, a control terminal and an N-well $DNW_{NX1}$ and the positive voltage holding transistor NY1 also has a first terminal, a second terminal, a control terminal and an N-well $DNW_{NY1}$. The N-well $DNW_{NY1}$ of the positive voltage holding transistor NY1 is coupled to the N-well $DNW_{NX1}$ of the negative voltage holding transistor NX1, and the N-well $DNW_{NY1}$ of the positive voltage holding transistor NY1 is floating. That is, although the N-well $DNW_{NY1}$ of the positive voltage holding transistor NY1 and the N-well $DNW_{NX1}$ of the negative voltage holding transistor NX1 are coupled together, they are not coupled to any other fixed voltages.

Figure 2:
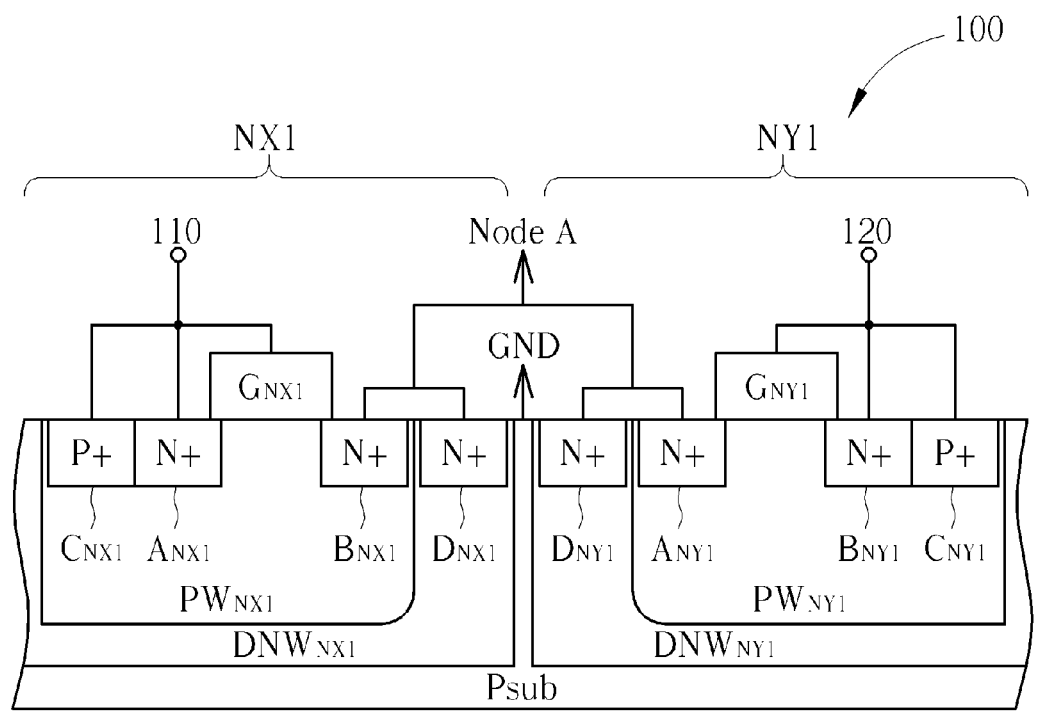
FIG. 2 shows a cross section of the structure of the discharge protection device in FIG. 1.

FIG. 2 shows a cross-section of the structure of the electrostatic discharge protection device 100. In FIG. 2, the first terminal of the negative voltage holding transistor NX1 is an N-type region $A_{NX1}$, the second terminal of the negative voltage holding transistor NX1 is an N-type region $B_{NX1}$, and the control terminal of the negative voltage holding transistor NX1 includes a gate $G_{NX1}$. The N-type regions $A_{NX1}$ and $B_{NX1}$ are both disposed in a P-well $PW_{NX1}$ of the negative voltage holding transistor NX1, and the P-well $PW_{NX1}$ of the negative voltage holding transistor NX1 is disposed in the N-well $DNW_{NX1}$ of the negative voltage holding transistor NX1. The N-well $DNW_{NX1}$ of the negative voltage holding transistor NX1 can be a deep N-well disposed on the P substrate Psub. The P substrate Psub can be coupled to the ground terminal GND. In addition, the control terminal of the negative voltage holding transistor NX1 can be used for controlling the voltage of the P-well $PW_{NX1}$ under the gate $G_{NX1}$. To let the P-well $PW_{NX1}$ of the negative voltage holding transistor NX1 receive the voltage from the control terminal of the negative voltage holding transistor NX1 even more effectively, the control terminal of the negative voltage holding transistor NX1 can further include a P-type region $C_{NX1}$ in the P-well $PW_{NX1}$.

The first terminal of the positive voltage holding transistor NY1 is an N-type region $A_{NY1}$, the second terminal of the positive voltage holding transistor NY1 is an N-type region $B_{NY1}$, and the control terminal of the positive voltage holding transistor NY1 includes a gate $G_{NY1}$. The N-type regions $A_{NY1}$ and $B_{NY1}$ are both disposed in a P-well $PW_{NY1}$ of the positive voltage holding transistor NY1, and the P-well $PW_{NY1}$ of the positive voltage holding transistor NY1 is disposed in the N-well $DNW_{NY1}$ of the positive voltage holding transistor NY1. The N-well $DNW_{NY1}$ of the positive voltage holding transistor NY1 can be a deep N-well disposed on the P substrate Psub. In addition, the control terminal of the positive voltage holding transistor NY1 can be used for controlling the voltage of the P-well $PW_{NY1}$ under the gate $G_{NY1}$. To let the P-well $PW_{NY1}$ of the positive voltage holding transistor NY1 receive the voltage from the control terminal of the positive voltage holding transistor NY1 even more effectively, the control terminal of the positive voltage holding transistor NY1 can further include a P-type region $C_{NY1}$ in the P-well $PW_{NY1}$.

In FIG. 2, to make it even more convenient for the N-well $DNW_{NX1}$ of the negative voltage holding transistor NX1 to couple to external elements, an N-type region $D_{NX1}$ can be disposed in the N-well $DNW_{NX1}$ of the negative voltage holding transistor NX1 so the N-well $DNW_{NX1}$ can be coupled to the external elements via the N-type region $D_{NX1}$. Similarly, to make it even more convenient for the N-well $DNW_{NY1}$ of the positive voltage holding transistor NY1 to couple to external elements, an N-type region $D_{NY1}$ can be disposed in the N-well $DNW_{NY1}$ of the positive voltage holding transistor NY1 so the N-well $DNW_{NY1}$ can be coupled to the external elements via the N-type region $D_{NY1}$. However, in some embodiments of the present invention, the external elements can also be coupled to the N-well $DNW_{NX1}$ and N-well $DNW_{NY1}$ directly without going through the N-type region $D_{NX1}$ and N-type region $D_{NY1}$.

The first terminal (N-type region $A_{NX1}$) of the negative voltage holding transistor NX1 is coupled to the control terminal (the gate $G_{NX1}$ and the P-type region $C_{NX1}$) of the negative voltage holding transistor NX1, and the second terminal (N-type region $B_{NX1}$) of the negative voltage holding transistor NX1 is coupled to the N-well $DNW_{NX1}$ of the negative voltage holding transistor NX1 directly or via the N-type region $D_{NX1}$. The control terminal (the gate $G_{NX1}$ and the P-type region $C_{NX1}$) of the negative voltage holding transistor NX1 is coupled to the anode 110. The first terminal (N-type region $A_{NY1}$ of the positive voltage holding transistor NY1 is coupled to the second terminal (N-type region $B_{NX1}$) of the negative voltage holding transistor NX1, and the second terminal (N-type region $B_{NY1}$) of the positive voltage holding transistor NY1 is coupled to the control terminal (gate $G_{NY1}$ and P-type region $C_{NY1}$) of the positive voltage holding transistor NY1. The control terminal (the gate $G_{NY1}$ and the P-type region $C_{NY1}$) of the positive voltage holding transistor NY1 is coupled to the cathode 120. Also, the N-well $DNW_{NX1}$ of the negative voltage holding transistor NX1 can also be coupled to the N-well $DNW_{NY1}$ of the positive voltage holding transistor NY1 via the N-type regions $D_{NX1}$ and $D_{NY1}$.

In other words, the negative voltage holding transistor NX1 and the positive voltage holding transistor NY1 can be coupled in series between the anode 110 and the cathode 120 in a manner of the back-to-back, that is, the control terminal (gate $G_{NY1}$ and P-type region $C_{NY1}$) of the positive voltage holding transistor NY1 is coupled to the second terminal (N-type region $B_{NY1}$) of the positive voltage holding transistor NY1, which is closer to the cathode 120, while the control terminal (gate $G_{NX1}$ and P-type region $C_{NX1}$) of the negative voltage holding transistor NX1 is coupled to the first terminal (N-type region $A_{NX1}$) of the negative voltage holding transistor NX1, which is closer to the anode 110.

When a voltage V1 of the anode 110 is higher than the ground voltage of the cathode 120, the P-type region $C_{NX1}$ and the N-type region $A_{NX1}$ of the negative voltage holding transistor NX1 are both at the voltage V1, and the P-type region $C_{NY1}$ and the N-type region $B_{NY1}$ of the positive voltage holding transistor NY1 are both at the ground voltage. In this case, the P-well $PW_{NX1}$ and the N-type region $B_{NX1}$ of the negative voltage holding transistor NX1 can be seen as a forward diode, and the N-type region $A_{NY1}$ and the P-well $PW_{NY1}$ of the positive voltage holding transistor NY1 can be seen as a reverse diode. That is, as long as the voltage gap between the voltage V1 and the ground voltage does not exceed the breakdown voltage of the positive voltage holding transistor NY1, the reverse diode between N-type region $A_{NY1}$ and the P-well $PW_{NY1}$ of the positive voltage holding transistor NY1 will stay off so that the electrostatic discharge protection device 100 will not conduct any currents. Furthermore, since the N-well $DNW_{NX1}$ of the negative voltage holding transistor NX1 and the N-well $DNW_{NY1}$ of the positive voltage holding transistor NY1 are coupled to the N-type region $B_{NX1}$ of the negative voltage holding transistor NX1 and the N-type region $A_{NY1}$ of the positive voltage holding transistor NY1, voltages of the N-well $DNW_{NX1}$ of the negative voltage holding transistor NX1 and the N-well $DNW_{NY1}$ of the positive voltage holding transistor NY1 are both higher than the ground voltage of the P-type substrate Psub, preventing current leakage of the electrostatic discharge protection device 100.

However, if the voltage V1 is induced by electrostatic discharge, the voltage gap between the voltage V1 and the ground voltage may exceed the breakdown voltage of the positive voltage holding transistor NY1. In this case, the reverse diode between N-type region $A_{NY1}$ and the P-well $PW_{NY1}$ of the positive voltage holding transistor NY1 will break down and will be turned on so that the electrostatic discharge protection device 100 can provide a discharge path for the huge current induced by the electrostatic discharge and prevent the chip from being damaged by the huge current.

Contrarily, when a voltage V2 of the anode 110 is lower than the ground voltage of the cathode 120, that is, when the voltage between the anode 110 and the cathode 120 is negative, the P-type region $C_{NX1}$ and the N-type region $A_{NX1}$ of the negative voltage holding transistor NX1 are both at the voltage V2, and the P-type region $C_{NY1}$ and the N-type region $B_{NY1}$ of the positive voltage holding transistor NY1 are both at the ground voltage. In this case, the P-well $PW_{NX1}$ and the N-type region $B_{NX1}$ of the negative voltage holding transistor NX1 can be seen as a reverse diode, and the N-type region $A_{NY1}$ and the P-well $PW_{NY1}$ of the positive voltage holding transistor NY1 can be seen as a forward diode. That is, as long as the negative voltage gap between the voltage V2 and the ground voltage does not exceed the breakdown voltage of the negative voltage holding transistor NX1, the reverse diode between P-well $PW_{NX1}$ and the N-type region $B_{NX1}$ of the negative voltage holding transistor NX1 will stay off so that the electrostatic discharge protection device 100 will not conduct any currents. Furthermore, although the N-well $DNW_{NX1}$ of the negative voltage holding transistor NX1 and the N-well $DNW_{NY1}$ of the positive voltage holding transistor NY1 may slightly lower than the ground voltage of the P-type substrate Psub, there is still no current path available around the P-type substrate Psub, avoiding the electrostatic discharge protection device 100 from generating any leakage current. That is, the leakage current can be avoided because the N-well $DNW_{NX1}$ of the negative voltage holding transistor NX1 and the N-well $DNW_{NY1}$ of the positive voltage holding transistor NY1 are coupled to the N-type region $B_{NX1}$ of the negative voltage holding transistor NX1 and the N-type region $A_{NY1}$ of the positive voltage holding transistor NY1.

However, if the voltage V2 is induced by electrostatic discharge, the voltage gap between the voltage V2 and the ground voltage may exceed the breakdown voltage of the negative voltage holding transistor NX1. In this case, the reverse diode between P-well $PW_{NX1}$ and the N-type region $B_{NX1}$ of the negative voltage holding transistor NX1 will break down and will be turned on so that the electrostatic discharge protection device 100 can provide a discharge path for the huge current induced by the electrostatic discharge and prevent the chip from being damaged by the huge current.

In other words, as long as the operational voltage range of the chip C1 does not exceed the breakdown voltage of the negative voltage holding transistor NX1 and the positive voltage holding transistor NY1, the electrostatic discharge protection device 100 will not be turned on when the input signals of the chip C1 is within the operational voltage range so that the chip C1 can be operated normally. Once the electrostatic discharge occurs, the negative voltage holding transistor NX1 or the positive voltage holding transistor NY1 may break down so that the electrostatic discharge protection device 100 can provide a discharge path for the huge current induced by the electrostatic discharge and prevent the chip from being damaged.

Consequently, the electrostatic discharge protection device 100 can protect the chip C1 from being damaged by the positive or negative electrostatic discharge.

Figure 3:
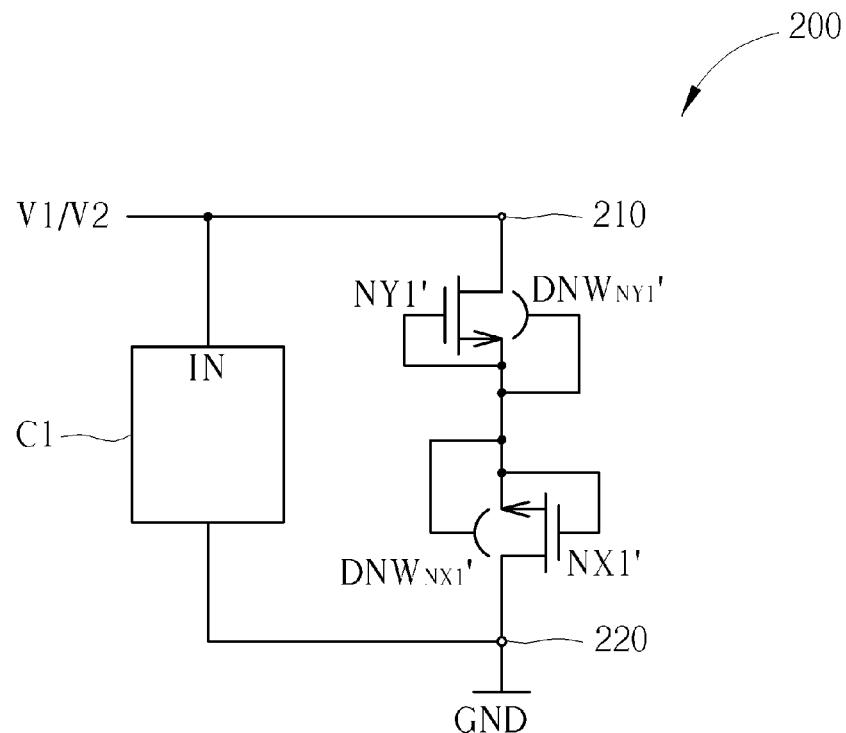
FIG. 3 shows an electrostatic discharge protection device according to another embodiment of the present invention.
Figure 4:
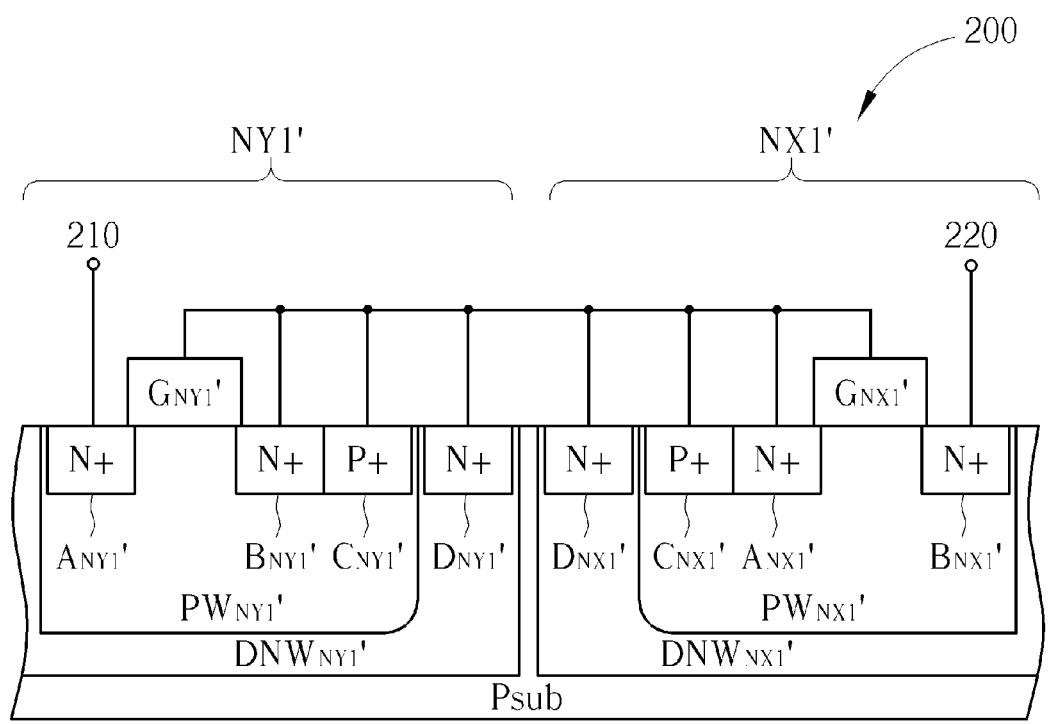
FIG. 4 shows a cross section of a structure of the discharge protection device in FIG. 3.

In FIG. 1, the anode 110 of the electrostatic discharge protection device 100 is coupled to the negative voltage holding transistor NX1, and the cathode 120 of the electrostatic discharge protection device 100 is coupled to the positive voltage holding transistor NY1. However, in some embodiments of the present invention, the negative voltage holding transistor can also be coupled to the cathode and the positive voltage holding transistor can also be coupled to the anode. FIG. 3 shows an electrostatic discharge protection device 200 according to one embodiment of the present invention. The electrostatic discharge protection device 200 includes an anode 210, a cathode 220, a negative voltage holding transistor NX1', and a positive voltage holding transistor NY1'. The negative voltage holding transistor NX1' has a similar structure as the negative voltage holding transistor NX1 does, and the positive voltage holding transistor NY1' has a similar structure as the positive voltage holding transistor NY1 does. The main difference between the electrostatic discharge protection devices 100 and 200 is in the connection. FIG. 4 shows a cross-section of the structure of the electrostatic discharge protection device 200.

In FIG. 3 the positive voltage holding transistor NY1' has a first terminal, a second terminal, a control terminal, and an N-well $DNW_{NY1'}$, and negative voltage holding transistor NX1' has a first terminal, a second terminal, a control terminal, and a N-well $DNW_{NX1'}$. In FIG. 4, the first terminal of the positive voltage holding transistor NY1' is the N-type region $A_{NY1'}$, the second terminal of the positive voltage holding transistor NY1' is the N-type region $B_{NY1'}$, and the control terminal of the positive voltage holding transistor NY1' includes the gate $G_{NY1'}$. The first terminal of the negative voltage holding transistor NX1' is the N-type region $A_{NX1'}$, the second terminal of the negative voltage holding transistor NX1' is the N-type region $B_{NX1'}$, and the control terminal of the negative voltage holding transistor NX1' includes the gate $G_{NX1'}$. In addition, the control terminal of the positive voltage holding transistor NY1' can be used to control the voltage level of the P-well $PW_{NY1'}$ under the gate $G_{NY1'}$. To let the P-well $PW_{NY1'}$ of the positive voltage holding transistor NY1' receive the voltage from the control terminal of the positive voltage holding transistor NY1' even more effectively, the control terminal of the positive voltage holding transistor NY1' can further include a P-type region $C_{NY1'}$ in the P-well $PW_{NY1'}$. To let the P-well $PW_{NX1'}$ of the negative voltage holding transistor NX1' receive the voltage from the control terminal of the negative voltage holding transistor NX1' even more effectively, the control terminal of the negative voltage holding transistor NX1' can further include a P-type region $C_{NX1'}$ in the P-well $PW_{NX1'}$.

The first terminal (N-type region $A_{NY1'}$) of the positive voltage holding transistor NY1' is coupled to the anode 210, and the second terminal (N-type region $B_{NY1'}$) of the positive voltage holding transistor NY1' is coupled to the control terminal (the gate $G_{NY1'}$ and the P-type region $C_{NY1'}$) of the positive voltage holding transistor NY1' and coupled to the N-well $DNW_{NY1'}$ of the positive voltage holding transistor NY1' via the N-type region $D_{NY1''}$. The first terminal (N-type region $A_{NX1'}$) of the negative voltage holding transistor NX1' is coupled to control terminal (the gate $G_{NX1'}$ and the P-type region $C_{NX1'}$) of the negative voltage holding transistor NX1', and the second terminal (N-type region $B_{NX1'}$) of the negative voltage holding transistor NX1' is coupled to the cathode 220. The control terminal (the gate $G_{NX1'}$ and the P-type region $C_{NX1'}$) of the negative voltage holding transistor NX1' is coupled to the second terminal (N-type region $B_{NY1'}$) of the positive voltage holding transistor NY1', and the N-well $DNW_{NY1'}$ of the positive voltage holding transistor NY1' is coupled to the N-well $DNW_{NX1'}$ of the negative voltage holding transistor NX1' via the N-type regions $D_{NX1'}$ and $D_{NY1''}$.

Since the negative voltage holding transistor NX1' and the positive voltage holding transistor NY1' are still coupled in series with a manner of back-to-back, the electrostatic discharge protection device 200 is still able to protect the chip C1. In other words, when the voltage V1 of the anode 210 is higher than the ground voltage of the cathode 220, the N-type region $A_{NY1'}$ and the P-well $PW_{NY1'}$ of the positive voltage holding transistor NY1' will form a reverse diode. Therefore, the electrostatic discharge protection device 200 will be turned on only when the voltage gap between the voltage V1 and the ground voltage exceeds the breakdown voltage of the positive voltage holding transistor NY1'. Similarly, when the voltage V2 of the anode 210 is lower than the ground voltage of the cathode 220, the N-type region $B_{NX1'}$ and the P-well $PW_{NX1'}$ of the negative voltage holding transistor NX1' will form a reverse diode. Therefore, the electrostatic discharge protection device 200 will be turned on only when the negative voltage gap between the voltage V2 and the ground voltage exceeds the breakdown voltage of the negative voltage holding transistor NX1'. Consequently, the electrostatic discharge protection device 200 can protect the chip C1 from being damaged without affecting the normal operations of the chip C1.

In addition, although the electrostatic discharge protection devices 100 and 200 both include one negative voltage holding transistor and one positive voltage holding transistor, in some embodiments of the present invention, the electrostatic discharge protection device may adjust the number of negative voltage holding transistors and positive voltage holding transistors according to the operational voltage range of the chip to be protected.

Figure 5:
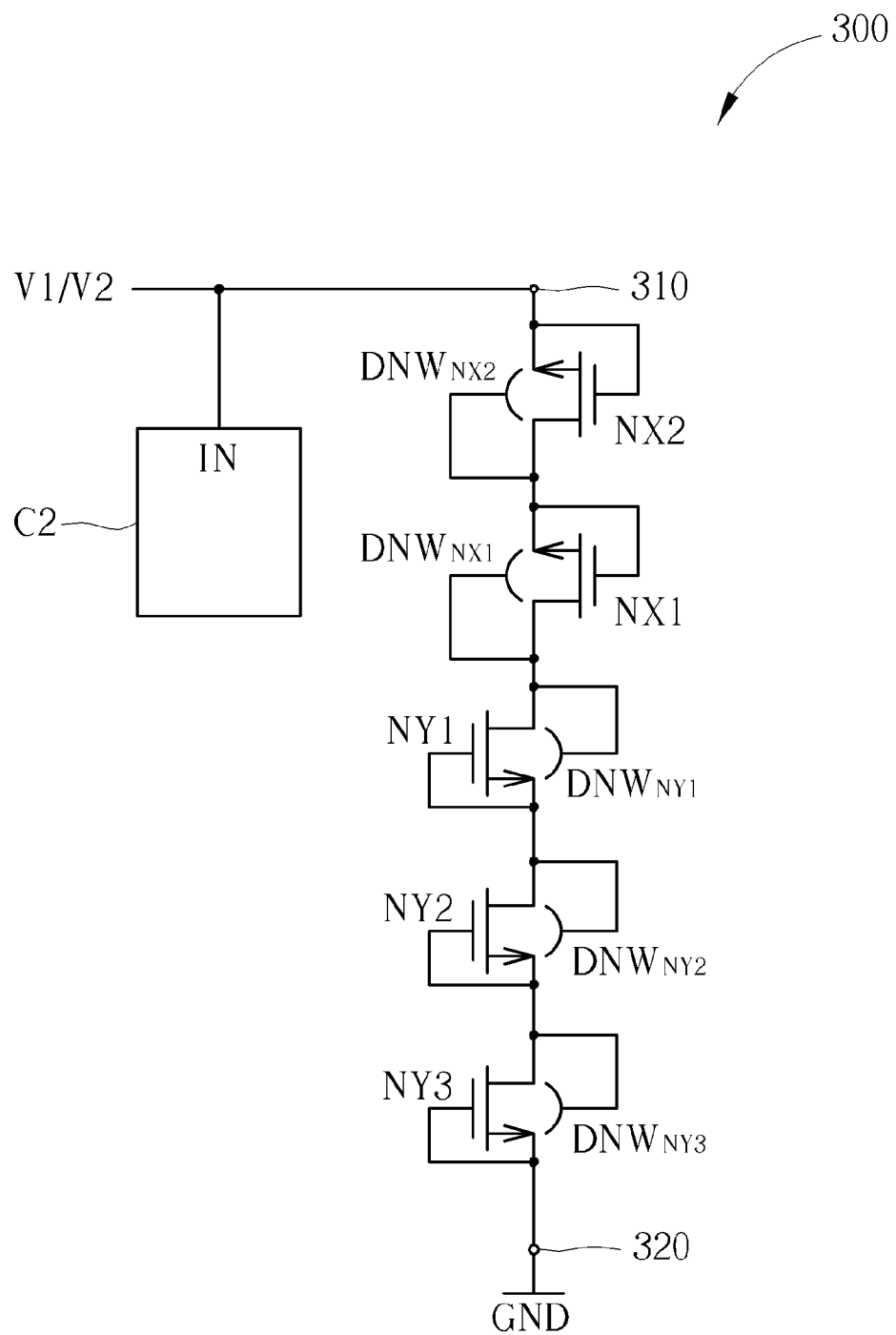
FIG. 5 shows an electrostatic discharge protection device according to another embodiment of the present invention.

FIG. 5 shows an electrostatic discharge protection device 300. The electrostatic discharge protection device 300 includes an anode 310, a cathode 320, a plurality of negative voltage holding transistors and a plurality of positive voltage holding transistors. The anode 310 is coupled to an input terminal IN of a chip C2 to be protected, and the cathode 320 is coupled to the ground terminal GND. If the operational voltage range of the chip C2 to be protected is between −8V and 14V and the breakdown voltages of the negative voltage holding transistors and the positive voltage holding transistors are about 5V, then the electrostatic discharge device 300 may include two negative voltage holding transistors NX1 and NX2 and three positive voltage holding transistors NY1, NY2, and NY3.

In this embodiment, the negative voltage holding transistors NX1 and NX2 and the positive voltage holding transistors NY1, NY2, and NY3 are all N-type metal oxide semiconductor transistors. The first terminal (N-type region) of the negative voltage holding transistor NX2 is coupled to the control terminal (P-type region) of the negative voltage holding transistor NX2, the second terminal (N-type region) of the negative voltage holding transistor NX2 is coupled to the N-well $DNW_{NX2}$ of the negative voltage holding transistor NX2, and the control terminal (P-type region) of the negative voltage holding transistor NX2 is coupled to the anode 310. The first terminal (N-type region) of the negative voltage holding transistor NX1 is coupled to the control terminal (P-type region) of the of the negative voltage holding transistor NX1, the second terminal (N-type region) of the negative voltage holding transistor NX1 is coupled to the N-well $DNW_{NX1}$ of the negative voltage holding transistor NX1, and the control terminal (P-type region) of the negative voltage holding transistor NX1 is coupled to the second terminal (N-type region) of the negative voltage holding transistor NX2.

The first terminal (N-type region) of the positive voltage holding transistor NY1 is coupled to the second terminal (N-type region) of the negative voltage holding transistor NX1 and the N-well $DNW_{NY1}$ of the positive voltage holding transistor NY1, and the second terminal (N-type region) of the positive voltage holding transistor NY1 is coupled to the control terminal (P-type region) of the positive voltage holding transistor NY1. The first terminal (N-type region) of the positive voltage holding transistor NY2 is coupled to the second terminal (N-type region) of the positive voltage holding transistor NY1 and the N-well $DNW_{NY2}$ of the positive voltage holding transistor NY2, and the second terminal (N-type region) of the positive voltage holding transistor NY2 is coupled to the control terminal (P-type region) of the positive voltage holding transistor NY2. The first terminal (N-type region) of the positive voltage holding transistor NY3 is coupled to the second terminal (N-type region) of the positive voltage holding transistor NY2 and the N-well $DNW_{NY3}$ of the positive voltage holding transistor NY3, the second terminal (N-type region) of the positive voltage holding transistor NY3 is coupled to the control terminal (P-type region) of the positive voltage holding transistor NY3, and the control terminal (P-type region) of the positive voltage holding transistor NY3 is coupled to the cathode 320.

Consequently, when the voltage V1 of the anode 310 is higher than the ground voltage of the cathode 320, the first terminal (N-type region) and the P-well below the control terminal in the positive voltage holding transistor NY1 will form a reverse diode, the first terminal (N-type region) and the P-well below the control terminal in the positive voltage holding transistor NY2 will form a reverse diode, and the first terminal (N-type region) and the P-well below the control terminal in the positive voltage holding transistor NY3 will forma reverse diode. Also, since the N-well $DNW_{NY1}$ of the positive voltage holding transistor NY1, the N-well $DNW_{NY2}$ of the positive voltage holding transistor NY2, and the N-well $DNW_{NY3}$ of the positive voltage holding transistor NY3 are not coupled to any fixed voltage, there is no discharging path between the N-wells $DNW_{NY1}$, $DNW_{NY2}$ and $DNW_{NY3}$ and the P-type substrate. Therefore, the electrostatic discharge protection device 300 will be turned on only when the voltage gap between the voltage V1 and the ground voltage exceeds the sum of the breakdown voltages of the positive voltage holding transistors NY1, NY2, and NY3, that is, when the voltage gap between the voltage V1 and the ground voltage exceeds 15V. Since the operational voltage range of the chip C2 is between −8V and 14V and does not exceed the sum of the breakdown voltages of the positive voltage holding transistors NY1, NY2, and NY3, the electrostatic discharge protection device 300 will not be turned on under normal operations so the chip C2 can still function normally.

Contrarily, when the voltage V2 of the anode 310 is lower than the ground voltage of the cathode 320, the first terminal (N-type region) and the P-well below the control terminal in the negative voltage holding transistor NX1 will forma reverse diode and the first terminal (N-type region) and the P-well below the control terminal in the negative voltage holding transistor NX2 will form a reverse diode. Also, since the N-well $DNW_{NX1}$ of the negative voltage holding transistor NX1 and the N-well $DNW_{NX2}$ of the negative voltage holding transistor NX2 are not coupled to any fixed voltage, there is no discharging path between the N-wells $DNW_{NX1}$ and $DNW_{NX2}$ and the P-type substrate. Therefore, the electrostatic discharge protection device 300 will be turned on only when the negative voltage gap between the voltage V2 and the ground voltage exceeds the sum of the breakdown voltages of the negative voltage holding transistors NX1 and NX2, that is, when the negative voltage gap between the voltage V2 and the ground voltage exceeds −10V. Since the operational voltage range of the chip C2 is between −8V and 14V and does not exceed the sum of the breakdown voltages of the negative voltage holding transistors NX1 and NX2, the electrostatic discharge protection device 300 will not be turned on under normal operations so the chip C2 can still function normally.

Consequently, the electrostatic discharge protection device 300 can increase the holding voltage by adding positive voltage holding transistors or negative voltage holding transistors to protect the chip C2 from being damaged by the electrostatic discharge without affecting the normal operations of the chip C2.

In addition, in electrostatic discharge protection device 300, the N-well $DNW_{NY1}$ of the positive voltage holding transistor NY1, the N-well $DNW_{NY2}$ of the positive voltage holding transistor NY2 and the N-well $DNW_{NY3}$ of the positive voltage holding transistor NY3 are coupled to the first terminal of the positive voltage holding transistor NY1, the first terminal of the positive voltage holding transistor NY2, and the first terminal of the positive voltage holding transistor NY3 respectively, and the N-well $DNW_{NX1}$ of the negative voltage holding transistor NX1 and the N-well $DNW_{NX2}$ of the negative voltage holding transistor NX2 are coupled to the first terminal of the negative voltage holding transistor NX1 and the first terminal of the negative voltage holding transistor NX2 respectively. However, in some embodiments, the N-well $DNW_{NY1}$ of the positive voltage holding transistor NY1, the N-well $DNW_{NY2}$ of the positive voltage holding transistor NY2, the N-well $DNW_{NY3}$ of the positive voltage holding transistor NY3, the N-well $DNW_{NX1}$ of the negative voltage holding transistor NX1 and the N-well $DNW_{NX2}$ of the negative voltage holding transistor NX2 can all be coupled together.

Figure 6:
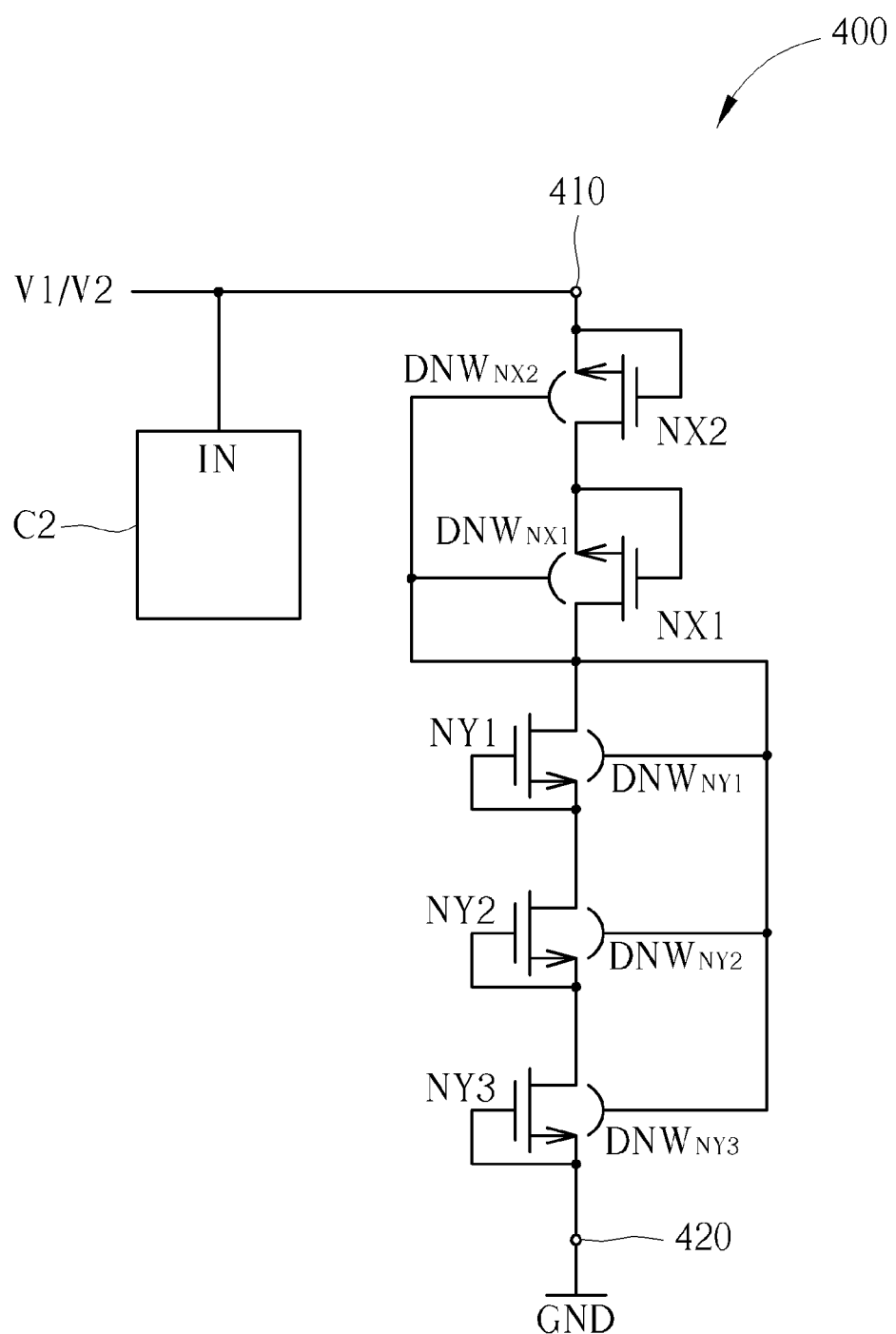
FIG. 6 shows an electrostatic discharge protection device according to another embodiment of the present invention.

FIG. 6 shows an electrostatic discharge device 400. The electrostatic discharge device 400 includes an anode 410, a cathode 420, positive voltage holding transistors NY1, NY2 and NY3, and negative voltage holding transistors NX1 and NX2. The electrostatic discharge protection devices 400 and 300 have similar structures, and the main difference between these two is in that the N-well $DNW_{NY1}$ of the positive voltage holding transistor NY1, the N-well $DNW_{NY2}$ of the positive voltage holding transistor NY2, the N-well $DNW_{NY3}$ of the positive voltage holding transistor NY3, the N-well $DNW_{NX1}$ of the negative voltage holding transistor NX1 and the N-well $DNW_{NX2}$ of the negative voltage holding transistor NX2 can all be coupled together at a same node in the electrostatic discharge protection device 400. Since the N-well $DNW_{NY1}$ of the positive voltage holding transistor NY1, the N-well $DNW_{NY2}$ of the positive voltage holding transistor NY2, the N-well $DNW_{NY3}$ of the positive voltage holding transistor NY3, the N-well $DNW_{NX1}$ of the negative voltage holding transistor NX1 and the N-well $DNW_{NX2}$ of the negative voltage holding transistor NX2 are not coupled to any fixed voltage, there is still no discharge path between P-type substrate and the N-wells $DNW_{NY1}$, $DNW_{NY2}$, $DNW_{NY3}$, $DNW_{NX1}$ and $DNW_{NX2}$. Therefore, the electrostatic discharge device 400 can still increase the holding voltage by adding positive voltage holding transistors or negative voltage holding transistors to meet the requirement of the system.

Figure 7:
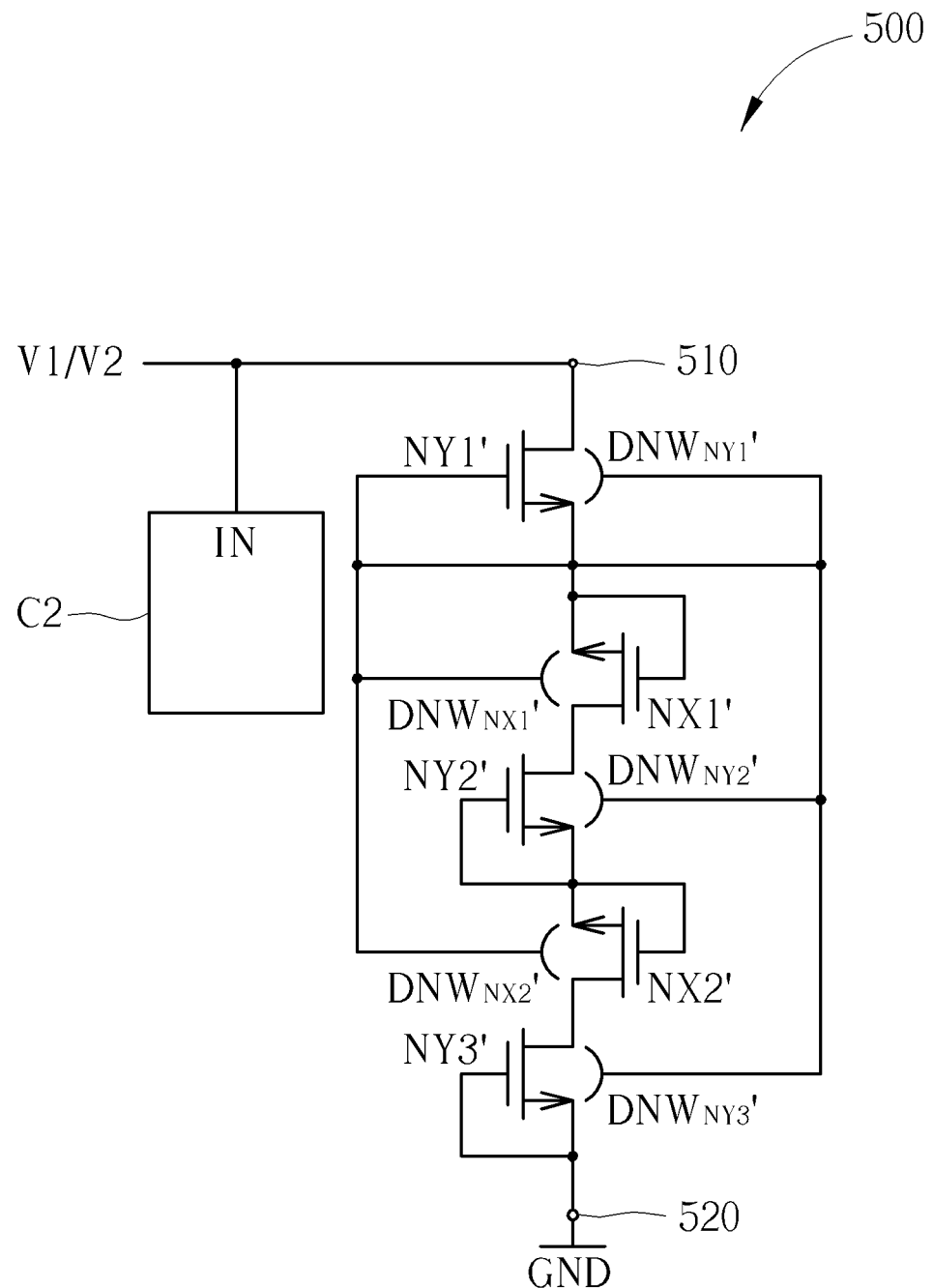
FIG. 7 shows an electrostatic discharge protection device according to another embodiment of the present invention.

Although in electrostatic discharge protection devices 300 and 400, the positive voltage holding transistors NY1, NY2 and NY3 are coupled in series one after another and the negative voltage holding transistors NX1 and NX2 are also coupled in series one after another, in some embodiments of the present invention, the positive voltage holding transistors NY1, NY2 and NY3 and the negative voltage holding transistors NX1 and NX2 can also be coupled in series with different random orders. FIG. 7 shows an electrostatic discharge protection device 500. The electrostatic discharge protection devices 500 and 300 have similar structures and operation principles, however, the positive voltage holding transistors NY1', NY2' and NY3' and the negative voltage holding transistors NX1' and NX2' in the electrostatic discharge protection device 500 are coupled between the anode 510 and the cathode 520 in an order of the positive voltage holding transistor NY1', the negative voltage holding transistor NX1', the positive voltage holding transistor NY2', the negative voltage holding transistor NX2', and the positive voltage holding transistor NY3'. Since each of the positive voltage holding transistors is coupled to the neighboring negative voltage holding transistors with a manner of back-to-back, each of the negative voltage holding transistors is coupled to the neighboring positive voltage holding transistors with a manner of back-to-back, and the N-wells $DNW_{NY1'}$, $DNW_{NY2'}$ and $DNW_{NY3'}$ of the positive voltage holding transistors NY1', NY2' and NY3' and the N-wells $DNW_{NX1'}$ and $DNW_{NX2'}$ of the negative voltage holding transistors NX1' and NX2' are all floating without being coupled to any fixed voltage, the breakdown voltages of the positive voltage holding transistors NY1', NY2' and NY3' can still be added to increase the holding voltage of the electrostatic discharge protection device 500 and breakdown voltages of the negative voltage holding transistors NX1' and NX2' can also be added to increase the holding voltage of the electrostatic discharge protection device 500.

In other words, when the operational voltage of the chip to be protected varies, the electrostatic discharge protection device may include a corresponding number of negative voltage holding transistors and/or positive voltage holding transistors while each of the negative voltage holding transistors and positive voltage holding transistors can be coupled in a random order with a manner of back-to-back. For example, the electrostatic discharge protection device 100 may further include at least one negative voltage holding transistor between the anode 110 and the negative voltage holding transistor NX1, or at least one negative voltage holding transistor between the positive voltage holding transistor NY1 and the cathode 120, or at least one positive voltage holding transistor between the anode 110 and the negative voltage holding transistor NX1, or at least one positive voltage holding transistor between the positive voltage holding transistor NY1 and the cathode 120.

Figure 8:
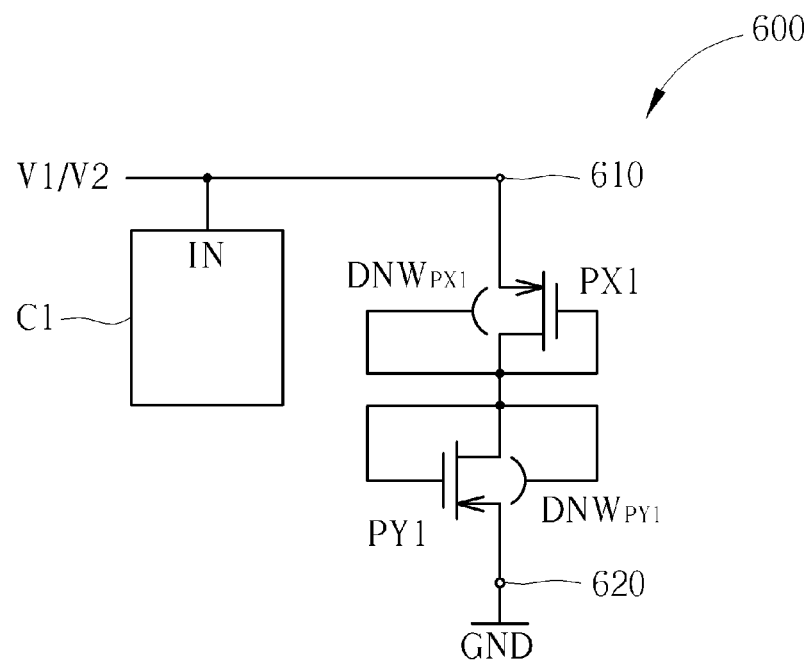
FIG. 8 shows an electrostatic discharge protection device according to another embodiment of the present invention.
Figure 9:
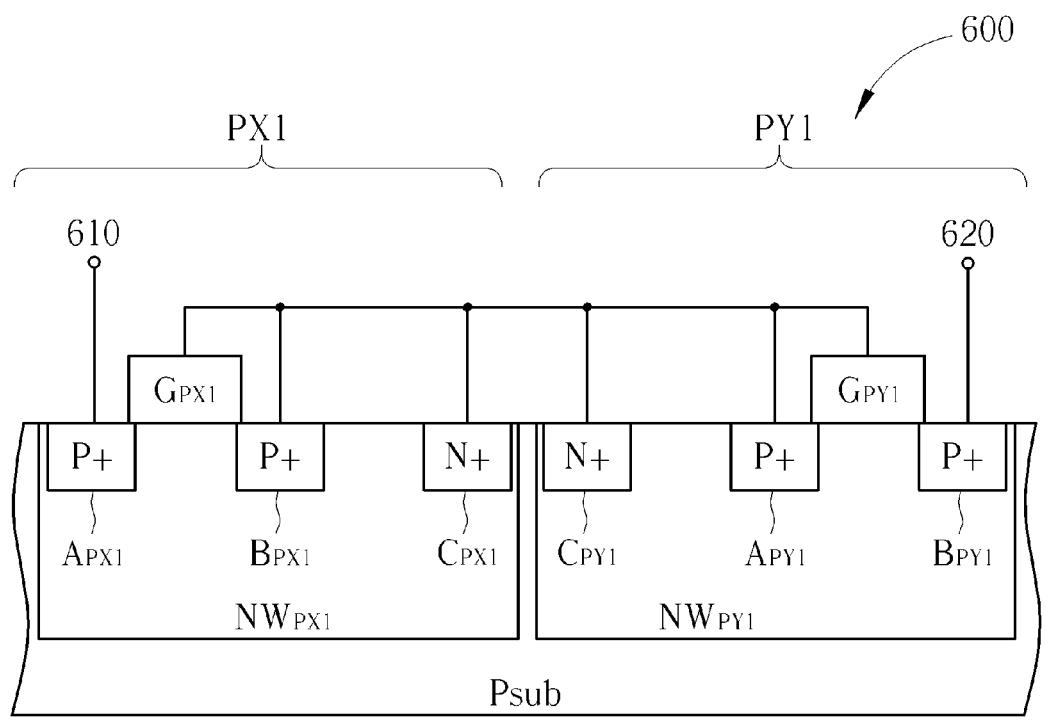
FIG. 9 shows a cross section of a structure of the discharge protection device in FIG. 8.

In addition, the electrostatic discharge protection devices 100 to 500 all use N-type metal oxide semiconductor transistors. However, in some embodiments of the present invention, the electrostatic discharge protection devices may also use P-type metal oxide semiconductor transistors. FIG. 8 shows an electrostatic discharge protection device 600 and FIG. 9 shows a cross-section of the structure of the electrostatic discharge protection device 600. The electrostatic discharge device 600 includes an anode 610, a cathode 620, a negative voltage holding transistor PX1 and a positive voltage holding transistor PY1. The anode 610 is coupled to the input terminal IN of the chip C1 to be protected, and the cathode 620 is coupled to the ground terminal GND. The negative voltage holding transistor PX1 and the positive voltage holding transistor PY1 are both P-type metal oxide semiconductor transistors.

In FIG. 8, the negative voltage holding transistor PX1 has a first terminal, a second terminal, a control terminal, and an N-well $NW_{PX1}$, and the positive voltage holding transistor PY1 has a first terminal, a second terminal, a control terminal, and an N-well $NW_{PY1}$. In FIG. 9, the P-type regions $A_{PX1}$ and $B_{PX1}$ are disposed in the N-well $NW_{PX1}$, the P-type regions $A_{PY1}$ and $B_{PY1}$ are disposed in the N-well $NW_{PY1}$, and the N-well $NW_{PY1}$ and N-well $NW_{PX1}$ are disposed in the P-type substrate Psub. The first terminal of the negative voltage holding transistor PX1 is the P-type region $A_{PX1}$, the second terminal of the negative voltage holding transistor PX1 is the P-type region $B_{PX1}$, and the control terminal of the negative voltage holding transistor PX1 includes a gate $G_{PX1}$. The first terminal of the positive voltage holding transistor PY1 is the P-type region $A_{PY1}$, the second terminal of the positive voltage holding transistor PY1 is the P-type region $B_{PY1}$, and the control terminal of the positive voltage holding transistor PY1 includes a gate $G_{PY1}$. The gate $G_{PY1}$ of the positive voltage holding transistor PY1 can be used for controlling the voltage of the N-well $NW_{PY1}$ under the gate $G_{PY1}$, and the gate $G_{PX1}$ of the negative voltage holding transistor PX1 can be used for controlling the voltage of the N-well $NW_{PX1}$ under the gate $G_{PX1}$. Therefore, to control the voltage level of the N-well $NW_{PY1}$ of the positive voltage holding transistor PY1 even more effectively, an N-type region $C_{PY1}$ can be disposed in the N-well $NW_{PY1}$ for coupling to external elements. Also to control the voltage level of the N-well $NW_{PX1}$ of the negative voltage holding transistor PX1 even more effectively, an N-type region $C_{PX1}$ can be disposed in the N-well $NW_{PX1}$ for coupling to external elements.

The first terminal (P-type region $A_{PX1}$) of the negative voltage holding transistor PX1 is coupled to the anode 610, and the second terminal (P-type region $B_{PX1}$) of the negative voltage holding transistor PX1 is coupled to the control terminal (gate $G_{PX1}$) of the negative voltage holding transistor PX1 and coupled to the N-well $NW_{PX1}$ of the negative voltage holding transistor PX1 via the N-type region $C_{PX1}$. The first terminal (P-type region $A_{PY1}$) of the positive voltage holding transistor PY1 is coupled to the control terminal (gate $G_{PY1}$) of the positive voltage holding transistor PY1, the second terminal (P-type region $B_{PY1}$) of the positive voltage holding transistor PY1 is coupled to the cathode 620, and the control terminal (gate $G_{PY1}$) of the positive voltage holding transistor PY1 is coupled to the second terminal (P-type region $B_{PX1}$) of the negative voltage holding transistor PX1. Also, the N-well $NW_{PY1}$ of the positive voltage holding transistor PY1 is coupled to N-well $NW_{PX1}$ of the negative voltage holding transistor PX1, but the N-well $NW_{PY1}$ of the positive voltage holding transistor PY1 and the N-well $NW_{PX1}$ of the negative voltage holding transistor PX1 are not coupled to any fixed voltage.

In the electrostatic discharge protection device 600, the N-well $NW_{PX1}$ of the negative voltage holding transistor PX1, the N-well $NW_{PY1}$ of the positive voltage holding transistor PY1, the second terminal (P-type region $B_{PX1}$) of the negative voltage holding transistor PX1, and the first terminal (P-type region $A_{PY1}$) of the positive voltage holding transistor PY1 are coupled together. In this embodiment, the control terminal (gate $G_{PX1}$) and the N-type region $C_{PX1}$ of the negative voltage holding transistor PX1 can both be used to input voltage to the N-well $NW_{PX1}$ so the control terminal (gate $G_{PX1}$) and the N-type region $C_{PX1}$ of the negative voltage holding transistor PX1 are at the same voltage level. Also, the control terminal (gate $G_{PY1}$ and the N-type region $C_{PY1}$ of the positive voltage holding transistor PY1 can both be used to input voltage to the N-well $NW_{PY1}$ so the control terminal (gate $G_{PY1}$) and the N-type region $C_{PY1}$ of the positive voltage holding transistor PY1 are at the same voltage level.

Consequently, when the voltage V1 of the anode 610 is higher than the ground voltage of the cathode 620, the N-well $NW_{PY1}$ and the P-type region $B_{PY1}$ of the negative voltage holding transistor PY1 will form a reverse diode. Therefore, the electrostatic discharge protection device 600 will be turned on only when the voltage gap between the voltage V1 and the ground voltage exceeds the breakdown voltage of the positive voltage holding transistor PY1. Similarly, when the voltage V2 of the anode 610 is lower than the ground voltage of the cathode 620, the N-well $NW_{PX1}$ and the P-type region $A_{PX1}$ of the positive voltage holding transistor PX1 will form a reverse diode. Therefore, the electrostatic discharge protection device 600 will be turned on only when the negative voltage gap between the voltage V2 and the ground voltage exceeds the breakdown voltage of the negative voltage holding transistor PX1. Therefore, the electrostatic discharge protection device 600 can protect the chip C1 from being damaged by the electrostatic discharge without affecting the normal operation of the chip C1.

Furthermore, since different types of transistors may have different breakdown voltages, different types of transistors may be chosen to produce the electrostatic discharge protection device according to the operational voltage range of the chip to be protected. For example, the electrostatic discharge protection device may adopt laterally diffused metal oxide semiconductor transistors, double diffused drain metal oxide semiconductor transistors, fully depleted metal oxide semiconductor transistors and/or bipolar junction transistors to be the negative voltage holding transistors and/or the positive voltage holding transistors.

Figure 10:
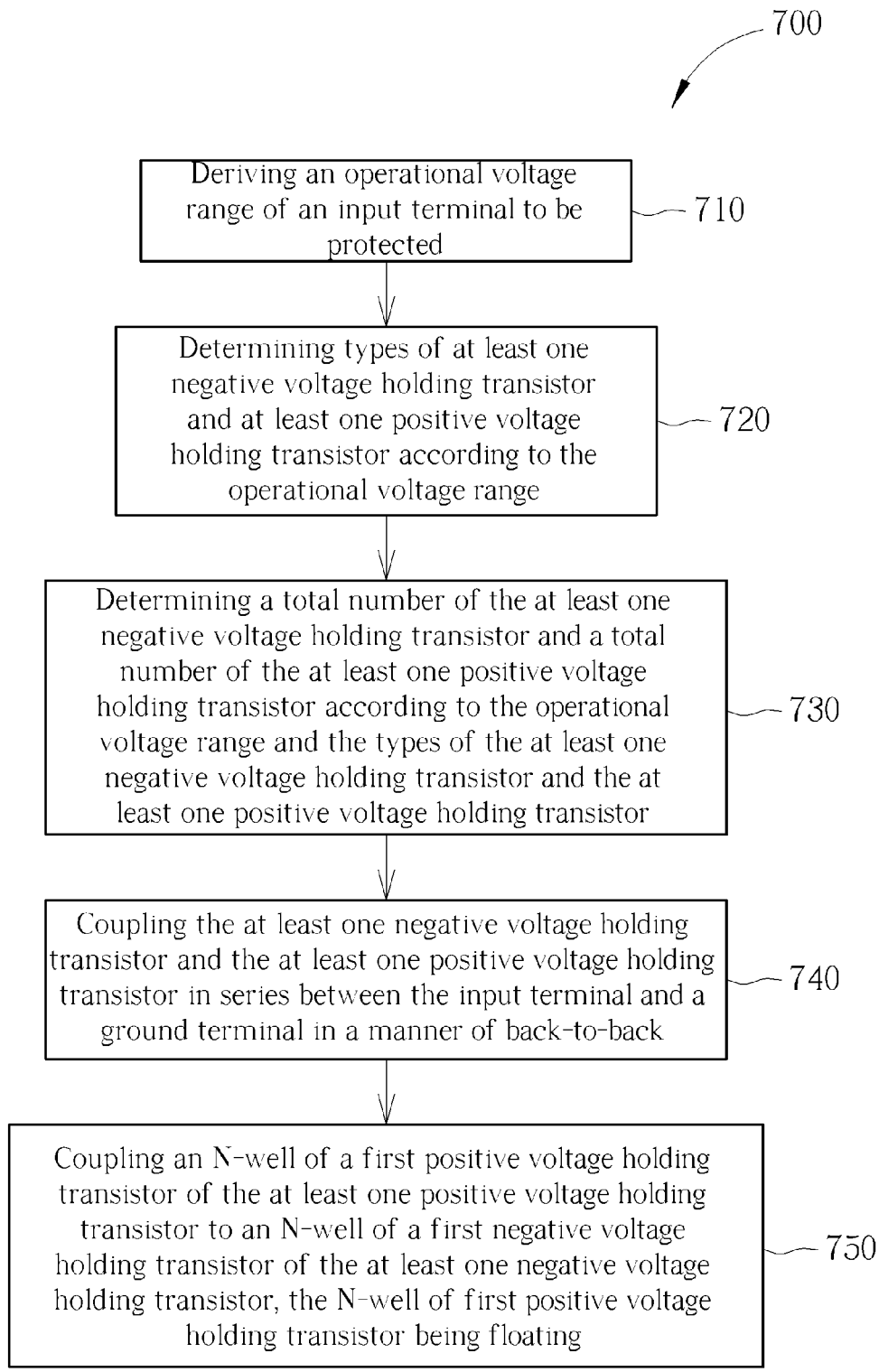
FIG. 10 shows a flow chart of a method for producing an electrostatic discharge protection device according to one embodiment of the present invention.

FIG. 10 shows a flow chart of a method 700 for producing an electrostatic discharge protection device. The method 700 includes steps S710 to S750.

S710: deriving an operational voltage range of an input terminal to be protected;

S720: determining types of at least one negative voltage holding transistor and at least one positive voltage holding transistor according to the operational voltage range;

S730: determining a total number of the at least one negative voltage holding transistor and a total number of the at least one positive voltage holding transistor according to the operational voltage range and the types of the at least one negative voltage holding transistor and the at least one positive voltage holding transistor;

S740: coupling the at least one negative voltage holding transistor and the at least one positive voltage holding transistor in series between the input terminal and a ground terminal in a manner of back-to-back;

S750: coupling an N-well of a first positive voltage holding transistor of the at least one positive voltage holding transistor to an N-well of a first negative voltage holding transistor of the at least one negative voltage holding transistor, the N-well of first positive voltage holding transistor being floating.

In step S710, the operational voltage range of the chip to be protected is derived firstly, and in step S720, the types of the negative voltage holding transistors and the positive voltage holding transistors are determined according to the operational voltage range.

For example, the step S720 may include determining the positive voltage holding transistor to be N-type metal oxide semiconductor transistors, P-type metal oxide semiconductor transistors, PNP bipolar junction transistors, or NPN bipolar junction transistors when an upper limit of the operational voltage range is below 15V, determining the positive voltage holding transistors to be N-type double diffused drain metal oxide semiconductor transistors or P-type double diffused drain metal oxide semiconductor transistors when the upper limit of the operational voltage range is between 15V and 30V, determining the positive voltage holding transistors to be N-type fully depleted metal oxide semiconductor transistors, P-type fully depleted metal oxide semiconductor transistors, N-type laterally diffused metal oxide semiconductor transistors or P-type laterally diffused metal oxide semiconductor transistors when the upper limit of the operational voltage range is between 30V and 65V, and/or determining the positive voltage holding transistors to be N-type laterally diffused metal oxide semiconductor transistors or P-type laterally diffused metal oxide semiconductor transistors when the upper limit of the operational voltage range is greater than 65V.

Similarly, the step S720 may also include determining the negative voltage holding transistor to be N-type metal oxide semiconductor transistors, P-type metal oxide semiconductor transistors, PNP bipolar junction transistors, or NPN bipolar junction transistors when an lower limit of the operational voltage range is above −15V, determining the negative voltage holding transistors to be N-type double diffused drain metal oxide semiconductor transistors or P-type double diffused drain metal oxide semiconductor transistors when the lower limit of the operational voltage range is between −15V and −30V, determining the negative voltage holding transistors to be N-type fully depleted metal oxide semiconductor transistors, P-type fully depleted metal oxide semiconductor transistors, N-type laterally diffused metal oxide semiconductor transistors or P-type laterally diffused metal oxide semiconductor transistors when the lower limit of the operational voltage range is between −30V and −65V, and/or determining the negative voltage holding transistors to be N-type laterally diffused metal oxide semiconductor transistors or P-type laterally diffused metal oxide semiconductor transistors when the lower limit of the operational voltage range is below −65V.

For example, if the operational voltage range of the chip C2 to be protected is between −8V and 14V, then the positive voltage holding transistors and the negative voltage holding transistors may be implemented by using N-type metal oxide semiconductor transistors, P-type metal oxide semiconductor transistors, PNP bipolar junction transistors, or NPN bipolar junction transistors due to the operational voltage range of the chip C2 is below 15V and above −15V.

After determining the types of the positive voltage holding transistors and the negative voltage holding transistors, in step S730, the total number of the negative voltage holding transistors and the total number of the positive voltage holding transistors is determined according to the operational voltage range and the types of the negative voltage holding transistors and the positive voltage holding transistors. To ensure that the electrostatic discharge device can protect the chip C2 without affecting the normal operations of the chip C2, when determining the total number of the negative voltage holding transistors and the total number of the positive voltage holding transistors, the sum of breakdown voltages of the positive voltage holding transistors should not be smaller than the upper limit of the operational voltage range and the sum of breakdown voltages of the negative voltage holding transistors should not be smaller than an absolute value of the lower limit of the operational voltage range.

For example, if the operational voltage range of the input terminal of the chip C2 is between −8V and 14V, then the positive voltage holding transistors and the negative voltage holding transistors can be implemented by N-type metal oxide semiconductor transistors. Also, since the breakdown voltage of an N-type metal oxide semiconductor transistor is about 5V, the total number of the positive voltage holding transistors can be set to 3 and the total number of the negative voltage holding transistors can be set to 2.

After determining the total number and types of the positive voltage holding transistors and the negative voltage holding transistors, in the step S740, the at least one negative voltage holding transistor and the at least one positive voltage holding transistor can be coupled in series between the input terminal and the ground terminal in a manner of back-to-back. For example, the positive voltage holding transistors and the negative voltage holding transistors can be coupled between the input terminal IN of the chip C2 and the ground terminal GND as the electrostatic discharge protection device 300 shown in FIG. 3. In this case, the N-well $DNW_{NY1}$ of the positive voltage holding transistor NY1 will be coupled to the N-well $DNW_{NX1}$ of the negative voltage holding transistor NX1 in the step S750 while the N-well $DNW_{NY1}$ of the positive voltage holding transistor NY1 and the N-well $DNW_{NX1}$ of the negative voltage holding transistor NX1 remain floating.

Figure 11:
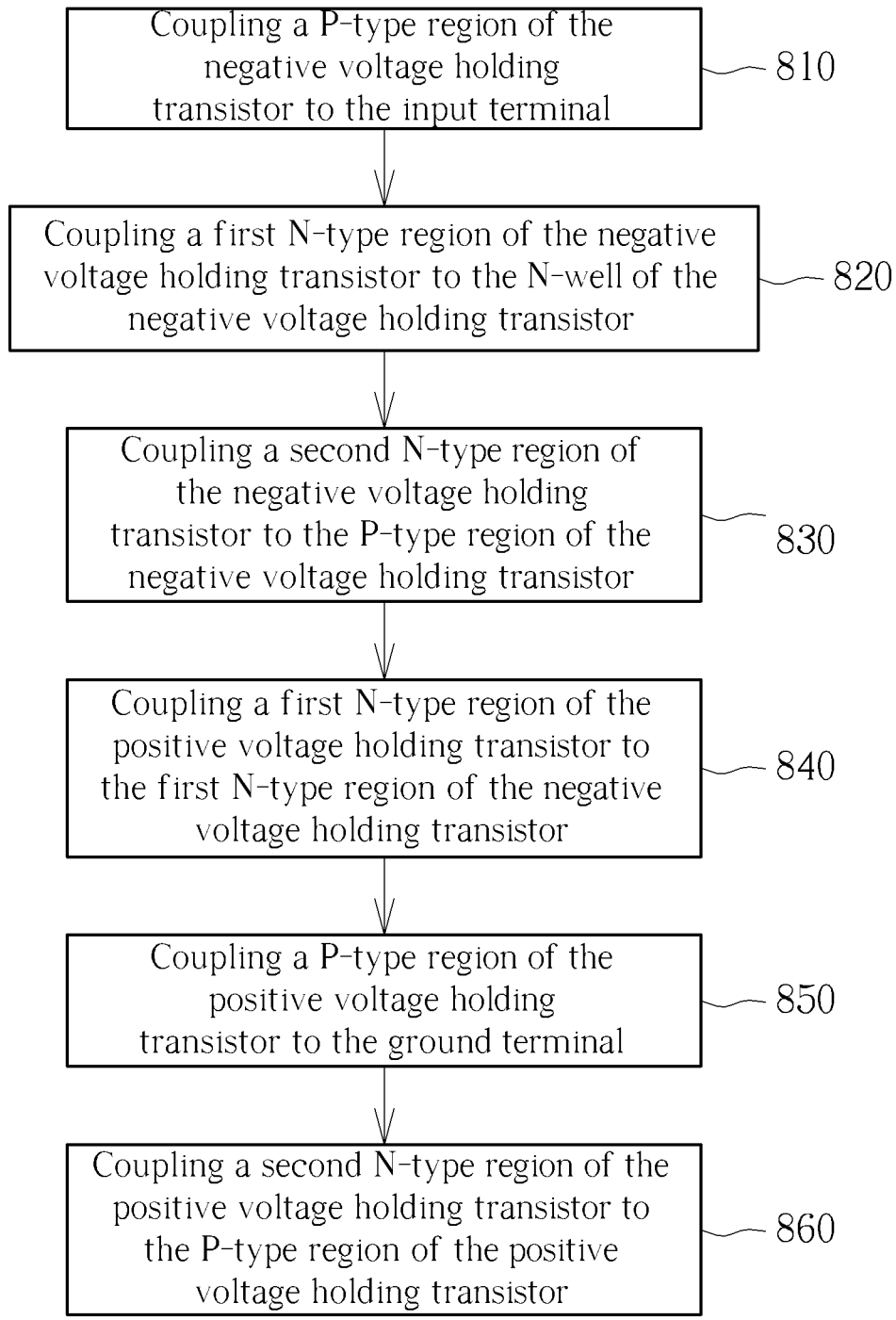
FIG. 11 shows a flow chart of parts of the method for producing an electrostatic discharge protection device in FIG. 10.

In some embodiments of the present invention, if the chip to be protected is the chip C1, then the method 700 may further include steps S810 to S860 for producing the electrostatic discharge protection device 100 after determining the types and the total numbers of the positive voltage holding transistor and the negative voltage holding transistor. FIG. 11 shows a flow chart of the steps S810 to S860.

S810 coupling a P-type region $C_{NX1}$ of the negative voltage holding transistor NX1 to the input terminal IN;

S820 coupling an N-type region $B_{NX1}$ of the negative voltage holding transistor NX1 to the N-well $DNW_{NX1}$ of the negative voltage holding transistor NX1;

S830 coupling an N-type region $A_{NX1}$ of the negative voltage holding transistor NX1 to the P-type region $C_{NX1}$ of the negative voltage holding transistor NX1;

S840 coupling an N-type region $A_{NY1}$ of the positive voltage holding transistor NY1 to the N-type region $B_{NX1}$ of the negative voltage holding transistor NX1;

S850 coupling a P-type region $C_{NY1}$ of the positive voltage holding transistor NY1 to the ground terminal GND; and S860 coupling an N-type region $B_{NY1}$ of the positive voltage holding transistor NY1 to the P-type region $C_{NY1}$ of the positive voltage holding transistor NY1.

Figure 12:
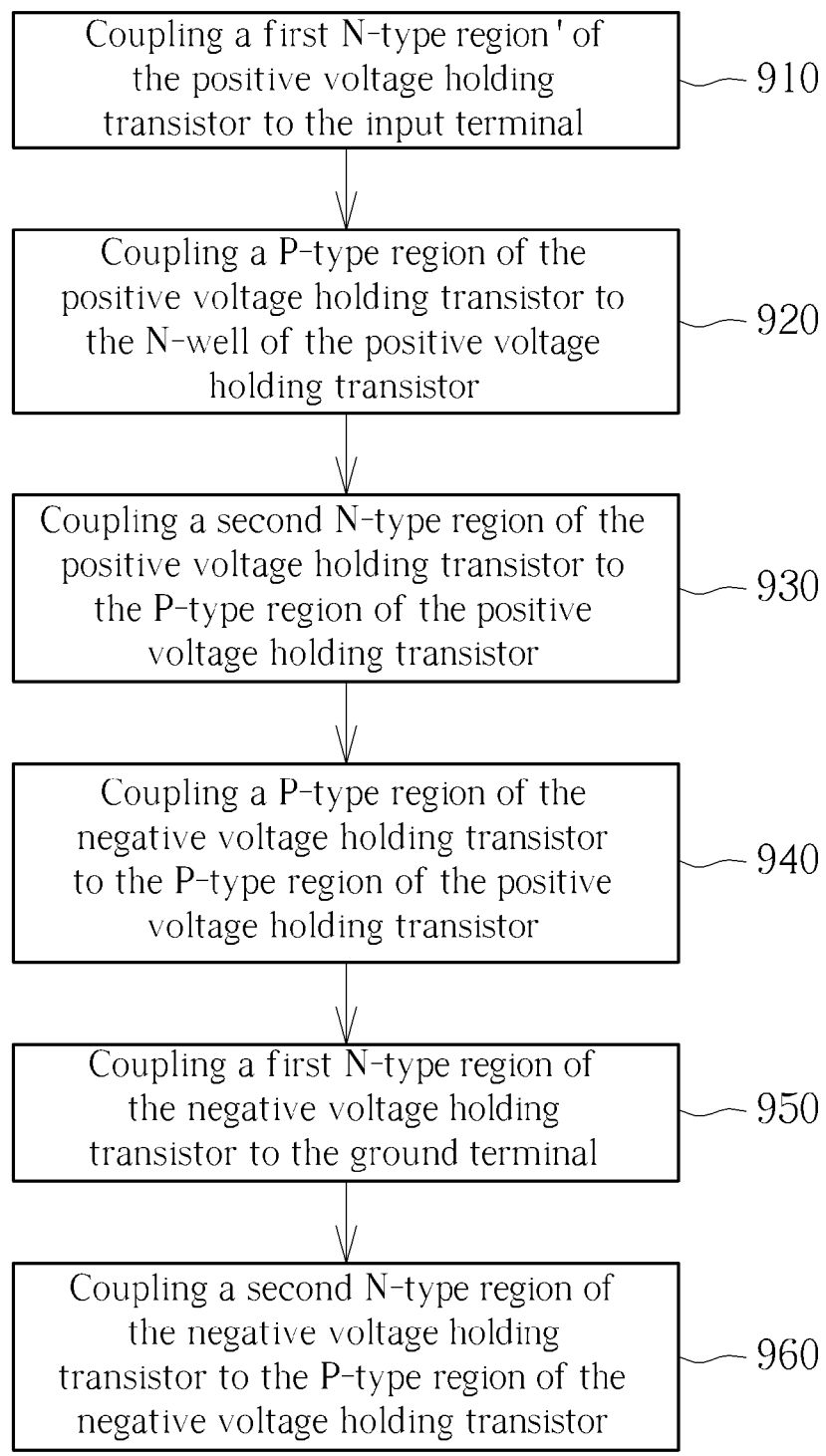
FIG. 12 shows a flow chart of parts of the method for producing an electrostatic discharge protection device in FIG. 10.

FIG. 12 shows a flow chart of the steps S910 to S960. In some embodiments of the present invention, if the chip to be protected is the chip C1, then the method 700 may further include steps S910 to S960 for producing the electrostatic discharge protection device 200.

S910 coupling an N-type region $A_{NY1'}$ of the positive voltage holding transistor NY1' to the input terminal IN;

S920 coupling a P-type region $C_{NY1'}$ of the positive voltage holding transistor NY1' to the N-well $DNW_{NY1'}$ of the positive voltage holding transistor NY1';

S930 coupling an N-type region $B_{NY1'}$ of the positive voltage holding transistor NY1' to the P-type region $C_{NY1'}$ of the positive voltage holding transistor NY1';

S940 coupling a P-type region $C_{NX1'}$ of the negative voltage holding transistor NX1' to the P-type region $C_{NY1'}$ of the positive voltage holding transistor NY1';

S950: coupling an N-type region $B_{NX1'}$ of the negative voltage holding transistor NX1' to the ground terminal GND; and S960: coupling an N-type region $A_{NX1'}$ of the negative voltage holding transistor NX1' to the P-type region $C_{NX1'}$ of the negative voltage holding transistor NX1'.

Figure 13:
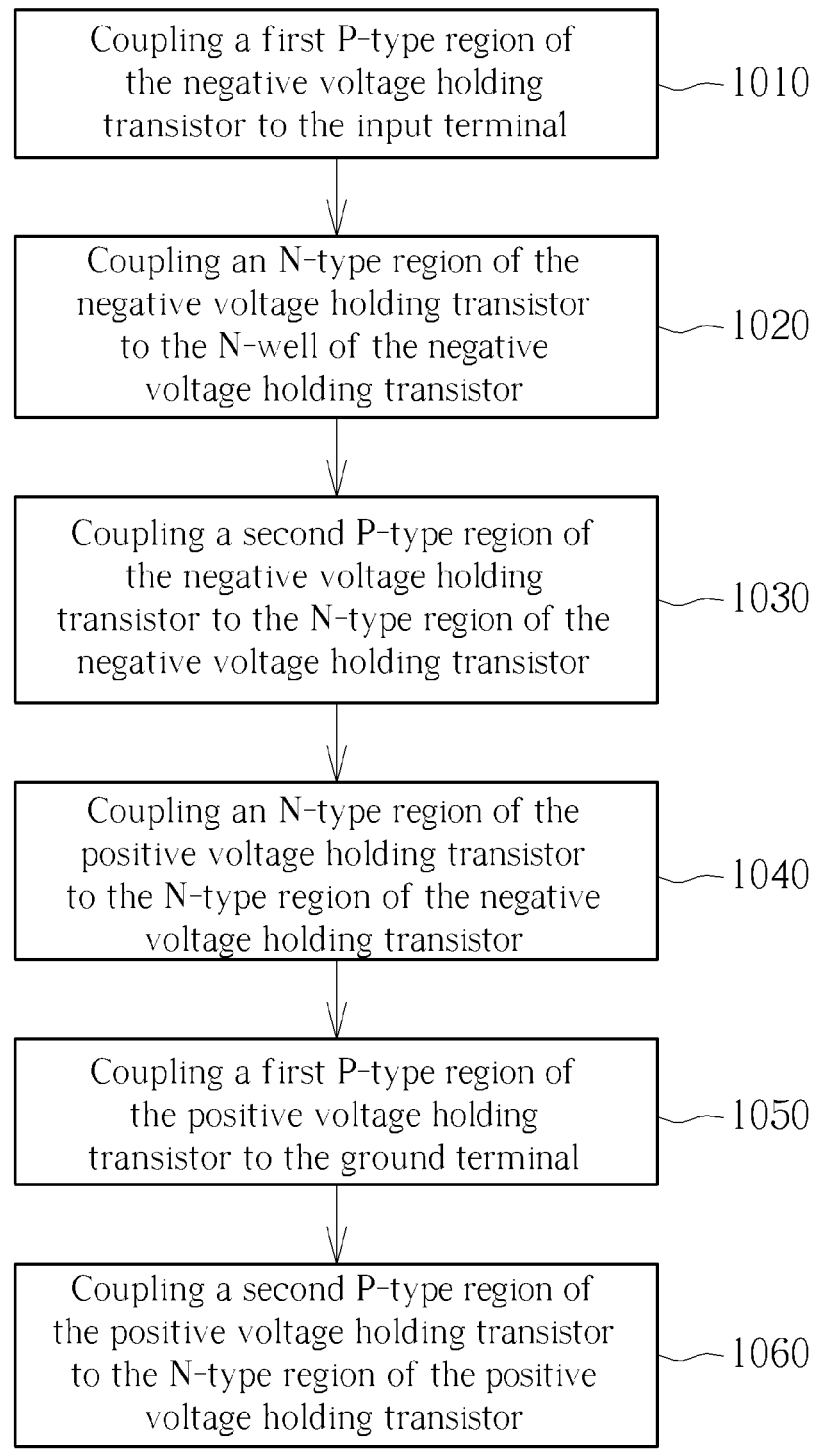
FIG. 13 shows a flow chart of parts of the method for producing an electrostatic discharge protection device in FIG. 10.

FIG. 13 shows a flow chart of the steps S1010 to S1060. In some embodiments of the present invention, if P-type metal oxide semiconductor transistors are chosen to implement the positive voltage holding transistor and the negative voltage holding transistor, then the method 700 may further include steps S1010 to S1060 and can be used for producing the electrostatic discharge protection device 600.

S1010: coupling a P-type region $A_{PX1}$ of the negative voltage holding transistor PX1 to the input terminal IN;

S1020: coupling an N-type region $C_{PX1}$ and a gate $G_{PX1}$ of the negative voltage holding transistor PX1 to the N-well $DNW_{PX1}$ of the negative voltage holding transistor PX1;

S1030: coupling a P-type region $B_{PX1}$ of the negative voltage holding transistor PX1 to the N-type region $C_{PX1}$ of the negative voltage holding transistor PX1;

S1040: coupling an N-type region $C_{PY1}$ and a gate $G_{PY1}$ of the positive voltage holding transistor PY1 to the N-type region $C_{PX1}$ and a gate $G_{PX1}$ of the negative voltage holding transistor PX1;

S1050: coupling a P-type region $B_{PY1}$ of the first positive voltage holding transistor PY1 to the ground terminal GND; and S1060: coupling a P-type region $A_{PY1}$ of the positive voltage holding transistor PY1 to the N-type region $C_{PY1}$ and the gate $G_{PY1}$ of the positive voltage holding transistor PY1.

The method 700 provides a method for producing an electrostatic discharge protection device according to the operational voltage range of a chip to be protected. Also, according to the method 700, the holding voltage of the electrostatic discharge protection device can be increased by adding positive voltage holding transistors and/or negative voltage holding transistors, and the electrostatic discharge protection device can provide protection to the chip from electrostatic discharge currents of dual directions. Therefore, the design of the electrostatic discharge protection device is even more flexible than the prior art.

In summary, the electrostatic discharge protection device and the method for producing electrostatic discharge protection device provided by the embodiments of the present invention can increase the holding voltage of the electrostatic discharge protection device by adding positive voltage holding transistors and/or negative voltage holding transistors, and are able to protect the chip from electrostatic discharge currents of dual directions. Therefore, the design of the electrostatic discharge protection device can be more flexible than the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection structure, comprising:
   an anode coupled to an input terminal;
   a cathode coupled to a ground terminal;
   a first negative voltage holding transistor comprising an N-well; and
   a first positive voltage holding transistor comprising an N-well coupled to the N-well of the first negative voltage holding transistor;
   wherein:
   the first negative voltage holding transistor and the first positive voltage holding transistor are coupled in series between the anode and the cathode in a manner of back-to-back; and
   the N-well of the first positive voltage holding transistor is floating.

2. The electrostatic discharge protection structure of claim 1, wherein:
   the first negative voltage holding transistor further comprises:
     a first P-type region coupled to the anode; and
     a first N-type region coupled to the N-well of the first negative voltage holding transistor; and
   the first positive voltage holding transistor further comprises:
     a first P-type region coupled to the cathode; and
     a first N-type region coupled to the first N-type region of the first negative voltage holding transistor.

3. The electrostatic discharge protection structure of claim 2, wherein:
   the first negative voltage holding transistor is a P-type transistor or a PNP bipolar junction transistor;
   the first negative voltage holding transistor further comprises a second P-type region coupled to the first N-type region of the first negative voltage holding transistor; and
   the first N-type region, the first P-type region, and the second P-type region of the first negative voltage holding transistor are disposed in the N-well of the first negative voltage holding transistor.

4. The electrostatic discharge protection structure of claim 2, wherein:
   the first positive voltage holding transistor is a P-type transistor or a PNP bipolar junction transistor;
   the first positive voltage holding transistor further comprises a second P-type region coupled to the first N-type region of the first positive voltage holding transistor; and
   the first N-type region, the first P-type region, and the second P-type region of the first positive voltage holding transistor are disposed in the N-well of the first positive voltage holding transistor.

5. The electrostatic discharge protection structure of claim 2, wherein:
   the first negative voltage holding transistor is an N-type transistor or an NPN bipolar junction transistor;

the first negative voltage holding transistor further comprises a second N-type region coupled to the first P-type region of the first negative voltage holding transistor;

the first N-type region, the first P-type region, and the second N-type region of the first negative voltage holding transistor are disposed in a P-well of the first negative voltage holding transistor; and the P-well of the first negative voltage holding transistor is disposed in the N-well of the first negative voltage holding transistor.

6. The electrostatic discharge protection structure of claim 2, wherein:

the first positive voltage holding transistor is an N-type transistor or an NPN bipolar junction transistor;

the first positive voltage holding transistor further comprises a second N-type region coupled to the first P-type region of the first positive voltage holding transistor;

the first N-type region, the first P-type region, and the second N-type region of the first positive voltage holding transistor are disposed in a P-well of the first positive voltage holding transistor; and the P-well of the first positive voltage holding transistor is disposed in the N-well of the first positive voltage holding transistor.

7. The electrostatic discharge protection structure of claim 1, wherein:

the first positive voltage holding transistor further comprises:
  a first N-type region coupled to the anode; and
  a first P-type region coupled to the N-well of the first positive voltage holding transistor; and the first negative voltage holding transistor further comprises:
  a first P-type region coupled to the first P-type region of the first positive voltage holding transistor; and
  a first N-type region coupled to the cathode.

8. The electrostatic discharge protection structure of claim 7, wherein:

the first negative voltage holding transistor is an N-type transistor or an NPN bipolar junction transistor;

the first negative voltage holding transistor further comprises a second N-type region coupled to the first P-type region of the first negative voltage holding transistor;

the first N-type region, the first P-type region, and the second N-type region of the first negative voltage holding transistor are disposed in a P-well of the first negative voltage holding transistor; and the P-well of the first negative voltage holding transistor is disposed in the N-well of the first negative voltage holding transistor.

9. The electrostatic discharge protection structure of claim 7, wherein:

the first positive voltage holding transistor is an N-type transistor or an NPN bipolar junction transistor;

the first positive voltage holding transistor further comprises a second N-type region coupled to the first P-type region of the first positive voltage holding transistor;

the first N-type region, the first P-type region, and the second N-type region of the first positive voltage holding transistor are disposed in a P-well of the first positive voltage holding transistor; and the P-well of the first positive voltage holding transistor is disposed in the N-well of the first positive voltage holding transistor.

10. The electrostatic discharge protection structure of claim 1, wherein the first negative voltage holding transistor is a metal oxide semiconductor transistor, a laterally diffused metal oxide semiconductor transistor, a double diffused drain metal oxide semiconductor transistor, a fully depleted metal oxide semiconductor transistor or a bipolar junction transistor, and the first positive voltage holding transistor is a metal oxide semiconductor transistor, a laterally diffused metal oxide semiconductor transistor, a double diffused drain metal oxide semiconductor transistor, a fully depleted metal oxide semiconductor transistor or a bipolar junction transistor.

11. The electrostatic discharge protection structure of claim 1, further comprising:
at least one second negative voltage holding transistor coupled in series between the anode and the first negative voltage holding transistor.

12. The electrostatic discharge protection structure of claim 1, further comprising:
at least one second positive voltage holding transistor coupled in series between the anode and the first negative voltage holding transistor.

13. The electrostatic discharge protection structure of claim 1, further comprising:
at least one second negative voltage holding transistor coupled in series between the cathode and the first positive voltage holding transistor.

14. The electrostatic discharge protection structure of claim 1, further comprising:
at least one second positive voltage holding transistor coupled in series between the cathode and the first positive voltage holding transistor.

15. A method for producing an electrostatic discharge protection structure, comprising:
deriving an operational voltage range of an input terminal to be protected;
determining types of at least one negative voltage holding transistor and at least one positive voltage holding transistor according to the operational voltage range;
determining a total number of the at least one negative voltage holding transistor and a total number of the at least one positive voltage holding transistor according to the operational voltage range and the types of the at least one negative voltage holding transistor and the at least one positive voltage holding transistor;
coupling the at least one negative voltage holding transistor and the at least one positive voltage holding transistor in series between the input terminal and a ground terminal in a manner of back-to-back; and
coupling an N-well of a first positive voltage holding transistor of the at least one positive voltage holding transistor to an N-well of a first negative voltage holding transistor of the at least one negative voltage holding transistor, the N-well of first positive voltage holding transistor being floating.

16. The method of claim 15, further comprising:
coupling a first P-type region of the first negative voltage holding transistor to the input terminal;
coupling a first N-type region of the first negative voltage holding transistor to the N-well of the first negative voltage holding transistor;
coupling a first N-type region of the first positive voltage holding transistor to the first N-type region of the first negative voltage holding transistor; and coupling a first P-type region of the first positive voltage holding transistor to the ground terminal.

17. The method of claim 16, wherein the first negative voltage holding transistor is an N-type transistor or an NPN bipolar junction transistor, and the method further comprises:
coupling a second N-type region of the first negative voltage holding transistor to the first P-type region of the first negative voltage holding transistor;
wherein the first N-type region, the first P-type region, and the second N-type region of the first negative voltage holding transistor are disposed in a P-well of the first negative voltage holding transistor, and the P-well of the first negative voltage holding transistor is disposed in the N-well of the first negative voltage holding transistor.

18. The method of claim 16, wherein the first negative voltage holding transistor is a P-type transistor or a PNP bipolar junction transistor, and the method further comprises:
coupling a second P-type region of the first negative voltage holding transistor to the first N-type region of the first negative voltage holding transistor;
wherein the first N-type region, the first P-type region, and the second P-type region of the first negative voltage holding transistor are disposed in the N-well of the first negative voltage holding transistor.

19. The method of claim 16, wherein the first positive voltage holding transistor is an N-type transistor or an NPN bipolar junction transistor, and the method further comprises:
coupling a second N-type region of the first positive voltage holding transistor to the first P-type region of the first positive voltage holding transistor;
wherein the first N-type region, the first P-type region, and the second N-type region of the first positive voltage holding transistor are disposed in a P-well of the first positive voltage holding transistor, and the P-well of the first positive voltage holding transistor is disposed in the N-well of the first positive voltage holding transistor.

20. The method of claim 16, wherein the first positive voltage holding transistor is a P-type transistor or a PNP bipolar junction transistor, and the method further comprises:
coupling a second P-type region of the first positive voltage holding transistor to the first N-type region of the first positive voltage holding transistor;
wherein the first N-type region, the first P-type region, and the second P-type region of the first positive voltage holding transistor are disposed in the N-well of the first positive voltage holding transistor.

21. The method of claim 15, further comprising:
coupling a first N-type region of the first positive voltage holding transistor to the input terminal;
coupling a first P-type region of the first positive voltage holding transistor to the N-well of the first positive voltage holding transistor;
coupling a first P-type region of the first negative voltage holding transistor to the first P-type region of the first positive voltage holding transistor; and
coupling a first N-type region of the first negative voltage holding transistor to the ground terminal.

22. The method of claim 21, wherein the first positive voltage holding transistor is an N-type transistor or an NPN bipolar junction transistor, and the method further comprises:
coupling a second N-type region of the first positive voltage holding transistor to the first P-type region of the first positive voltage holding transistor;
wherein the first N-type region, the first P-type region, and the second N-type region of the first positive voltage holding transistor are disposed in a P-well of the first positive voltage holding transistor, and the P-well of the first positive voltage holding transistor is disposed in the N-well of the first positive voltage holding transistor.

23. The method of claim 21, wherein the first negative voltage holding transistor is an N-type transistor or an NPN bipolar junction transistor, and the method further comprises:
coupling a second N-type region of the first negative voltage holding transistor to the first P-type region of the first negative voltage holding transistor;
wherein the first N-type region, the first P-type region, and the second N-type region of the first negative voltage holding transistor are disposed in a P-well of the first negative voltage holding transistor, and the P-well of the first negative voltage holding transistor is disposed in the N-well of the first negative voltage holding transistor.

24. The method of claim 15, wherein determining the types of the at least one negative voltage holding transistor and the at least one positive voltage holding transistor according to the operational voltage range is determining the at least one negative voltage holding transistor to be at least one metal oxide semiconductor transistor, laterally diffused metal oxide semiconductor transistor, double diffused drain metal oxide semiconductor transistor, fully depleted metal oxide semiconductor transistor or bipolar junction transistor according to the operational voltage range and determining the at least one positive voltage holding transistor to be at least one metal oxide semiconductor transistor, laterally diffused metal oxide semiconductor transistor, double diffused drain metal oxide semiconductor transistor, fully depleted metal oxide semiconductor transistor or bipolar junction transistor according to the operational voltage range.

25. The method of claim 15, wherein determining the types of the at least one negative voltage holding transistor and the at least one positive voltage holding transistor according to the operational voltage range comprises:
when an upper limit of the operational voltage range is below 15V, determining the at least one positive voltage holding transistor to be at least one N-type metal oxide semiconductor transistor, P-type metal oxide semiconductor transistor, PNP bipolar junction transistor, or NPN bipolar junction transistor; and
when a lower limit of the operational voltage range is above −15V, determining the at least one negative voltage holding transistor to be at least one N-type metal oxide semiconductor transistor, P-type metal oxide semiconductor transistor, PNP bipolar junction transistor, or NPN bipolar junction transistor.

26. The method of claim 15, wherein determining the types of the at least one negative voltage holding transistor and the at least one positive voltage holding transistor according to the operational voltage range comprises:
when an upper limit of the operational voltage range is between 15V and 30V, determining the at least one positive voltage holding transistor to be at least one N-type double diffused drain metal oxide semiconductor transistor or P-type double diffused drain metal oxide semiconductor transistor; and when a lower limit of the operational voltage range is between −15V and -30V, determining the at least one negative voltage holding transistor to be at least one N-type double diffused drain metal oxide semiconductor transistor or P-type double diffused drain metal oxide semiconductor transistor.

27. The method of claim 15, wherein determining the types of the at least one negative voltage holding transistor and the at least one positive voltage holding transistor according to the operational voltage range comprises:

when an upper limit of the operational voltage range is between 30V and 65V, determining the at least one positive voltage holding transistor to be at least one N-type fully depleted metal oxide semiconductor transistor, P-type fully depleted metal oxide semiconductor transistor, N-type laterally diffused metal oxide semiconductor transistor or P-type laterally diffused metal oxide semiconductor transistor; and when a lower limit of the operational voltage range is between −30V and -65V, determining the at least one negative voltage holding transistor to be at least one N-type fully depleted metal oxide semiconductor transistor, P-type fully depleted metal oxide semiconductor transistor, N-type laterally diffused metal oxide semiconductor transistor or P-type laterally diffused metal oxide semiconductor transistor.

28. The method of claim 15, wherein determining the types of the at least one negative voltage holding transistor and the at least one positive voltage holding transistor according to the operational voltage range comprises:

when an upper limit of the operational voltage range is greater than 65V, determining the at least one positive voltage holding transistor to be at least one N-type laterally diffused metal oxide semiconductor transistor or P-type laterally diffused metal oxide semiconductor transistor; and when a lower limit of the operational voltage range is below −65V, determining the at least one negative voltage holding transistor to be at least one N-type laterally diffused metal oxide semiconductor transistor or P-type laterally diffused metal oxide semiconductor transistor.

29. The method of claim 15, wherein determining the total number of the at least one negative voltage holding transistor and the total number of the at least one positive voltage holding transistor according to the operational voltage range and the types of the at least one negative voltage holding transistor and the at least one positive voltage holding transistor is:

making a sum of breakdown voltage of the at least one positive voltage holding transistor not smaller than an upper limit of the operational voltage range; and making a sum of breakdown voltage of the at least one negative voltage holding transistor not smaller than an absolute value of a lower limit of the operational voltage range.

* * * * *